(12) United States Patent
Hokanson et al.

(10) Patent No.: US 6,167,947 B1
(45) Date of Patent: Jan. 2, 2001

(54) HIGH PERFORMANCE GAS COOLING SYSTEM AND METHOD

(75) Inventors: Karl Hokanson, Coon Rapids, MN (US); Douglas M. Carlson; William Berg, both of Eau Claire, WI (US)

(73) Assignee: Silicon Graphics, Inc., Mountain View, CA (US)

( * ) Notice: Under 35 U.S.C. 154(b), the term of this patent shall be extended for 0 days.

(21) Appl. No.: 09/215,531

(22) Filed: Dec. 18, 1998

(51) Int. Cl.[7] .................... F28F 7/00; F24H 3/06; H05K 7/20

(52) U.S. Cl. ............... 165/80.3; 165/80.4; 165/122; 361/691; 361/696

(58) Field of Search .................. 361/696, 691, 361/699; 312/236; 165/80.4, 80.3, 122, 104.33, 104.32, 71

(56) References Cited

U.S. PATENT DOCUMENTS

| | | | |
|---|---|---|---|
| 1,641,247 | * 9/1927 | Bingay | 165/71 |
| 1,905,811 | * 4/1933 | Culver | 165/104.34 |
| 2,820,616 | * 1/1958 | Nabal et al. | 165/104.34 |
| 3,173,477 | * 3/1965 | Cuzzone | 165/104.34 |
| 3,536,132 | * 10/1970 | Pecoraro | 165/104.34 |
| 3,749,981 | * 7/1973 | Koltuniak et al. | 361/696 |
| 4,037,270 | 7/1977 | Ahmann et al. | 361/385 |
| 4,120,021 | 10/1978 | Roush | 361/388 |
| 4,447,842 | 5/1984 | Berg | 361/386 |
| 4,449,164 | 5/1984 | Carlson et al. | 361/384 |
| 4,600,050 | * 7/1986 | Noren | 165/104.14 |
| 4,858,069 | * 8/1989 | Hughes | 361/696 |
| 5,315,479 | 5/1994 | Bartilson et al. | 361/690 |
| 5,321,581 | 6/1994 | Bartilson et al. | 361/695 |
| 5,490,871 | * 2/1996 | Coates et al. | 95/23 |
| 5,706,668 | * 1/1998 | Hilpert | 361/696 |
| 5,768,104 | 6/1998 | Salmonson et al. | 361/704 |
| 5,805,418 | 9/1998 | Salmonson et al. | 361/704 |
| 5,896,268 | * 4/1999 | Beavers | 361/691 |

* cited by examiner

*Primary Examiner*—Ira S. Lazarus
*Assistant Examiner*—Tho Duong
(74) *Attorney, Agent, or Firm*—Schwegman, Lundberg, Woessner & Kluth, P.A.

(57) ABSTRACT

The present invention relates to an improved system and method for cooling electronic devices. The present system is particularly adapted for cooling computer equipment. The system comprises a sealed enclosure which houses one or more heat generating electronic devices; a blower; and a heat exchanger. The sealed enclosure may be pressurized with a gas medium such as dry nitrogen up to a pressure of approximately two atmospheres. The elevated pressure increases the gas density, effectively increasing the mass flow rate and heat carrying capacity of the gas. The blower is also a constant volume device such that it can move the same volume of gas regardless of density. Accordingly, for a given heat load, the size of the blower may be reduced. Or, alternatively, a given blower can cool a device having a higher heat load. Finally, by pressurizing the enclosure, the present invention eliminates the need to size a forced air cooling system based on high elevation requirements.

6 Claims, 7 Drawing Sheets

HIGH PERFORMANCE GAS COOLING SYSTEM AND METHOD

STATEMENT REGARDING GOVERNMENT RIGHTS

The present invention was made with government support under MDA 904-96-C-1519, awarded by ARPA. The Government has certain rights in this invention.

TECHNICAL FIELD

This invention relates generally to systems and methods for cooling electronic components and, more particularly, to systems and methods for cooling computer electronics using an elevated pressure enclosure.

BACKGROUND OF THE INVENTION

Electronic equipment may generate a substantial amount of heat during operation. In order to keep this equipment operating effectively and reliably, it is necessary to cool the equipment by removing the excessive heat. Failure to do so may result in component failure and possibly fire.

While cooling systems are necessary for many types of electronic equipment, one area in which they are perceived to be critical is computer applications. The present invention relates primarily to cooling computer equipment and the remainder of this discussion will focus on the same.

Various techniques are known for removing heat energy including: natural convection air; forced air; cold plates (cooled masses that are in contact or in close proximity to the heat generating device); and direct contact liquid cooling. While all these methods have distinct advantages, forced air cooling is often the method of choice for cooling computer equipment. Forced air cooling devices generally comprise either an axial fan or a radial (i.e., centrifugal) blower. In larger computer systems, the centrifugal blower is more commonly used. The centrifugal blower has a cylindrical, rotating impeller that pulls air in through an inlet parallel to its axis and then expels the air tangentially to the impeller.

Forced air cooling is advantageous over other cooling methods for several reasons. First, forced air cooling devices are generally simple to integrate into the computer enclosure. Additionally, these devices are commercially available in a wide variety of sizes and are thus cost effective. Furthermore, forced air cooling devices have proven to be highly reliable.

Even with these advantages though, forced air cooling does have limitations. To explain, removal of a specific quantity of heat energy from a computer system utilizing forced air cooling requires a computer designer to predict the thermal resistance of the moving air and the temperature differential between the air stream and the device to be cooled. Since larger temperature differentials are undesirable, optimization of forced air cooling systems typically focuses on reducing thermal resistance.

Thermal resistance is a measure of the resistance of the moving air to absorb heat energy and is inversely related to the convective heat transfer coefficient. One factor affecting thermal resistance is the velocity of the air moving over the electronic device. Generally speaking, the higher the air velocity, the lower the thermal resistance. Another factor is the available surface area of the electronic component to be cooled. Typically, surface area is increased by attaching a plurality of protrusions or "fins" to the component. These fins conduct heat away from the component and provide increased area in contact with the moving air. To lower the thermal resistance, the number of fins per unit area (i.e., fin density) may be increased.

While increased fluid velocity and fin density will effectively decrease the thermal resistance, these changes also increase the pressure drop within the system, necessitating a larger and more powerful blower. When blower size and volumetric flow rate requirements exceed certain levels, forced air cooling becomes impracticable and the computer designer must often resort to more complex and more costly cooling techniques.

Yet another problem with forced air cooling concerns the decrease in air density present at higher elevations. Since blowers are generally constant-volume devices (i.e., they move a constant volume of air regardless of the air density), a particular cooling system will generally move the same volume of air regardless of air density variations. However, the heat carrying capacity of air is directly proportional to the air density. Thus, a given volume of air at a high elevation cannot carry as much heat as the same volume of air at a lower elevation. Since it is not practicable to provide different cooling system for different altitudes, forced cooling systems are generally designed for the worst case scenario (i.e., for high altitude installations). When these systems are used at lower altitudes, they suffer a penalty in both blower size and cost.

Thus, there are limitations restricting the use of forced air cooling systems within computer systems. What is needed is a cooling device having the reliability, cost efficiency and simplicity of the forced air cooling device but having similar heat removal capabilities regardless of altitude. What is further needed is a cooling device which is more compact and has lower power requirements than the conventional forced air cooling device.

SUMMARY OF THE INVENTION

A system and method for cooling heat generating devices is described. The method comprises enclosing the heat generating device in an enclosure having a gas moving device and a heat exchanging device; sealing the enclosure; delivering a gas into the enclosure; pressurizing the gas within the enclosure to a first pressure, the first pressure being greater than an ambient pressure outside the enclosure; circulating the gas within the enclosure with the gas moving device; and removing a quantity of heat energy from the enclosure with the heat exchanging device. The system comprises an enclosure surrounding the heat generating devices, wherein the enclosure is sealable to retain a gas at a first pressure, the first pressure being greater than an ambient pressure outside the enclosure; a gas moving device for circulating the gas within the enclosure proximal the heat generating devices; and a heat removing apparatus, wherein the heat removing apparatus transfers a quantity of heat energy from the enclosure.

According to another aspect of the invention, a computer system is described having one or more heat generating electronic components; an enclosure surrounding the heat generating electronic components wherein the enclosure has a sealable interior volume allowing the enclosure to retain a gas within the interior volume at a first pressure, the first pressure being greater than an ambient pressure outside the enclosure; a gas moving device for circulating the gas within the enclosure proximal the heat generating electronic components; and a heat exchanging apparatus for removing a quantity of heat energy from the enclosure.

According to yet another aspect of the invention, a computer system is described comprising an upper cylindrical portion; a lower cylindrical portion, wherein the lower cylindrical portion mates with the upper cylindrical portion to define an interior volume capable of retaining a gas at a first pressure, the first pressure being greater than an ambient pressure outside the enclosure; one or more heat generating electronic components located within the interior volume; a centrifugal blower located within the interior volume; and one or more heat exchangers located within the interior volume, wherein the heat exchangers remove a quantity of heat energy from the system.

According to still yet another aspect of the invention, a computer system is described comprising an enclosure having an interior volume capable of retaining a gas at a first pressure, the first pressure being greater than an ambient pressure outside the enclosure; one or more heat generating electronic devices located within the interior volume; a centrifugal blower located within the interior volume; and one or more heat exchangers located within the interior volume, wherein the heat exchangers remove a quantity of heat energy from the system.

A method for cooling a computer system is also disclosed comprising providing an enclosure having one or more heat generating electronic components, a gas moving device, and a heat exchanger; sealing the enclosure; pressurizing a gas within the enclosure to a first pressure, the first pressure being greater than an ambient pressure outside the enclosure; activating the gas moving device to recirculate the gas therein; activating the heat exchanger; and activating the heat generating electronic components, whereby a quantity of heat energy is transferred from the heat generating electronic components to the gas and from the gas to the heat exchanger.

Accordingly, a system and method is described permitting the use of forced air cooling in an elevated pressure environment. As a result, forced air cooling may be used in applications where it would normally be prohibitive. In addition, the present invention permits a reduction in blower size for a given heat removal requirement. Furthermore, the present invention eliminates the need to size a forced air cooling system based on high elevation requirements. Thus, the forced air system and method described herein provide an alternative to sophisticated and expensive liquid cooling techniques.

BRIEF DESCRIPTION OF THE DRAWINGS

The invention described herein will be further characterized with reference to the drawings, wherein.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention. It is also noted that the terms "up" and "down" or "horizontal" and "vertical" are used throughout the specification only for descriptive purposes and are not intended to limit the scope of the invention in any way.

Figure 1:
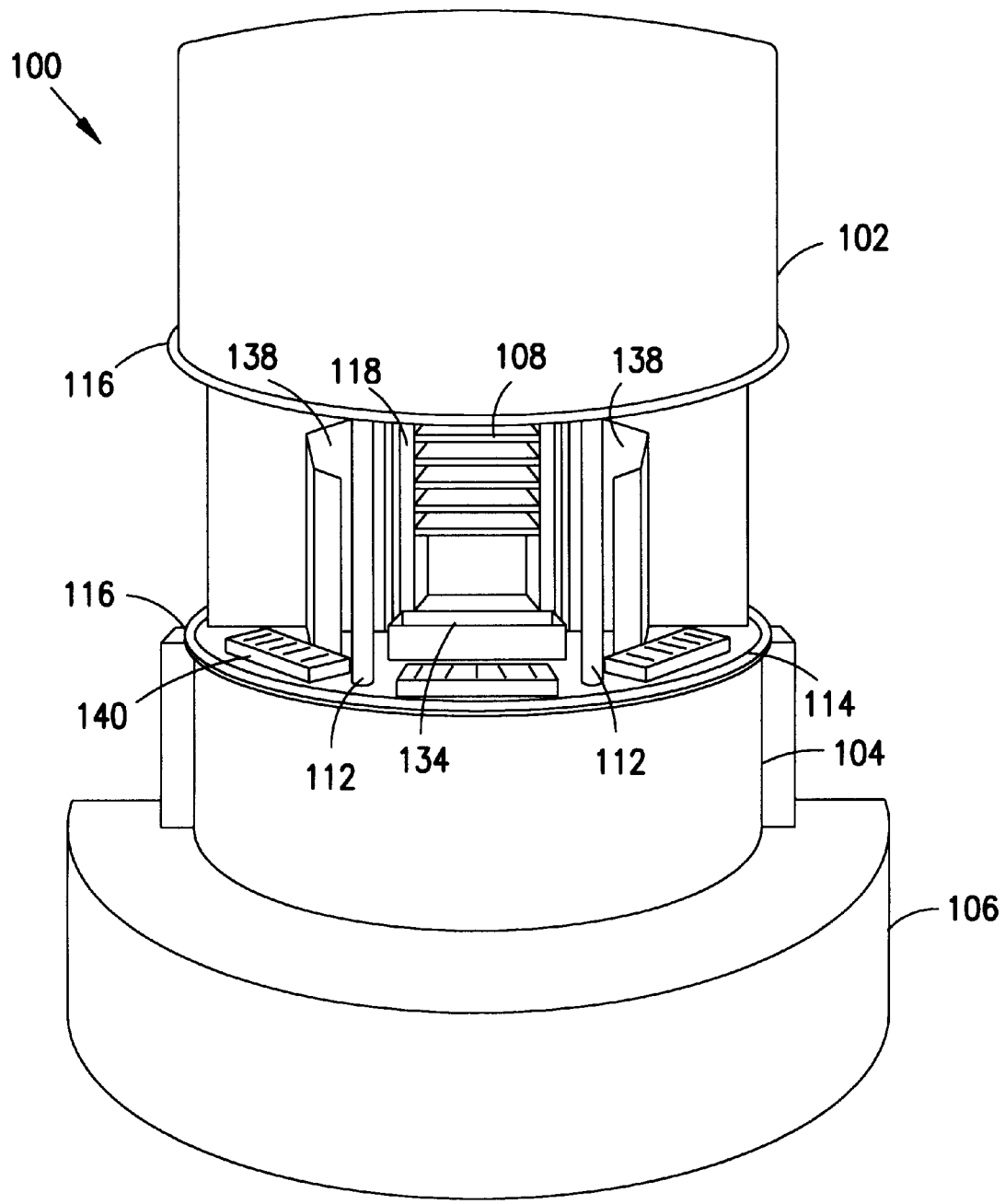
FIG. 1 is a perspective view of one embodiment of a computer system in accordance with the present invention.

Referring to FIG. 1, a computer system 100 in accordance with one embodiment of the invention is shown. The system 100 comprises a generally cylindrical, hollow upper body portion 102 and a mating lower body portion 104. In FIG. 1, the system is shown with the upper portion 102 in a raised or open position. The system 100 may further comprise a base 106 to accommodate various components as further described below. The upper portion 102 lowers to mate with the lower portion 104 in a closed position as shown in FIG. 2, forming a sealed compartment or volume therein.

Still referring to FIG. 1, a plurality of heat generating devices such as electronic components 108 are enclosed within the system 100. During operation, the components 108 generate a substantial amount of heat. In order to operate efficiently and reliably, the heat energy must be continuously removed from the system 100. Accordingly, a gas moving device such as a blower 110 (best shown in FIG. 4) is used to circulate the gas within the sealed compartment and a heat removing apparatus 140 (also shown in FIG. 4) is then used to remove heat energy therefrom. Utilizing a pressurized gas source (not shown), the pressure within the compartment may be elevated to an internal pressure greater than the pressure external to the system 100 (i.e., ambient pressure). By elevating the pressure, the density and the heat carrying capacity of the gas within the compartment are proportionally increased as further discussed below. Because of the elevated heat carrying capacity of the gas, the blower 110 may be a smaller unit than would be required in a conventional forced air system. Thus, forced air or forced gas cooling in accordance with the present invention may be used in applications where before it was considered inadequate.

Having described the system 100 in general terms, attention will now be focused on one embodiment as described generally in FIGS. 1–5. Referring first to FIG. 1, the computer system 100 is shown in its open position. A lift mechanism 112 is used to raise and lower the upper portion 102. The particular construction of the lift mechanism is, for the most part, not central to the invention and will not be discussed in detail herein. However, various mechanisms including but not limited to electric ball-screw devices and pneumatic cylinders that are operated by hand or motor power are within the scope of the invention. In addition, various guide members (not shown) may be used to guide the upper portion during movement. When the upper portion is lowered, a sealing assembly having a first sealing surface 114 on the lower portion 104 and a second, mating surface (not shown) on the upper portion 102 is provided. Thus, an enclosed volume having an air-tight seal is formed. While shown as a face seal, other sealing configurations are also possible within the scope of the invention.

Figure 2:
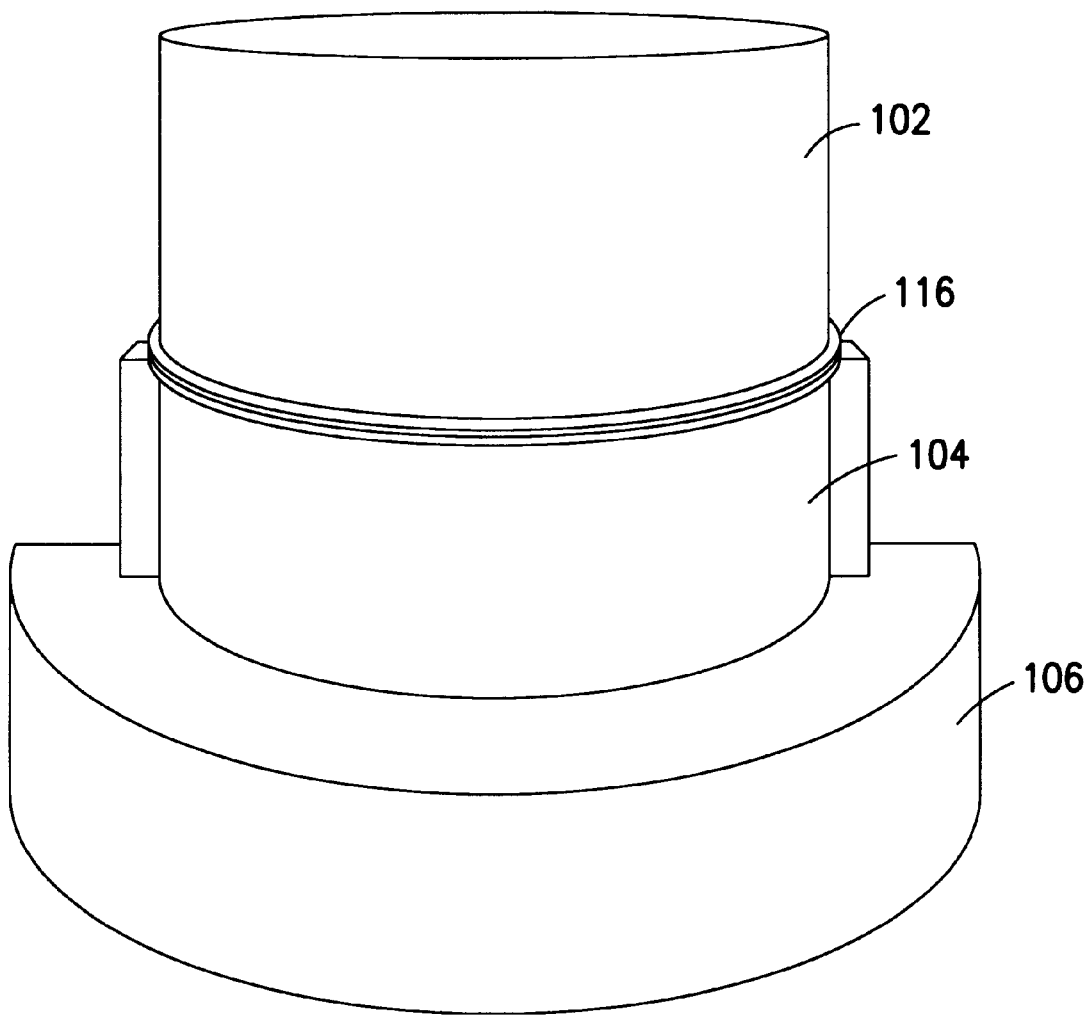
FIG. 2 is a perspective view of the computer system of FIG. 1 shown in its closed position.

When the upper portion 102 is in the closed position, the system 100 appears as shown in FIG. 2. Once closed, the upper portion 102 may be secured to the lower portion 104 in any one of a variety of ways. For example, the lifting mechanism 112 may also operatively retain the upper portion in the closed position. Alternatively, a lip 116 on both the upper portion 102 and the lower portion 104 may be used as a clamping surface, thereby permitting a circumferential clamp member (not shown) to be secured around the periphery. Yet another option includes an automated clamping apparatus (also not shown) located on the inside of the system 100. Other methods of securing the upper portion 102 to the lower portion 104 are also possible.

Figure 3:
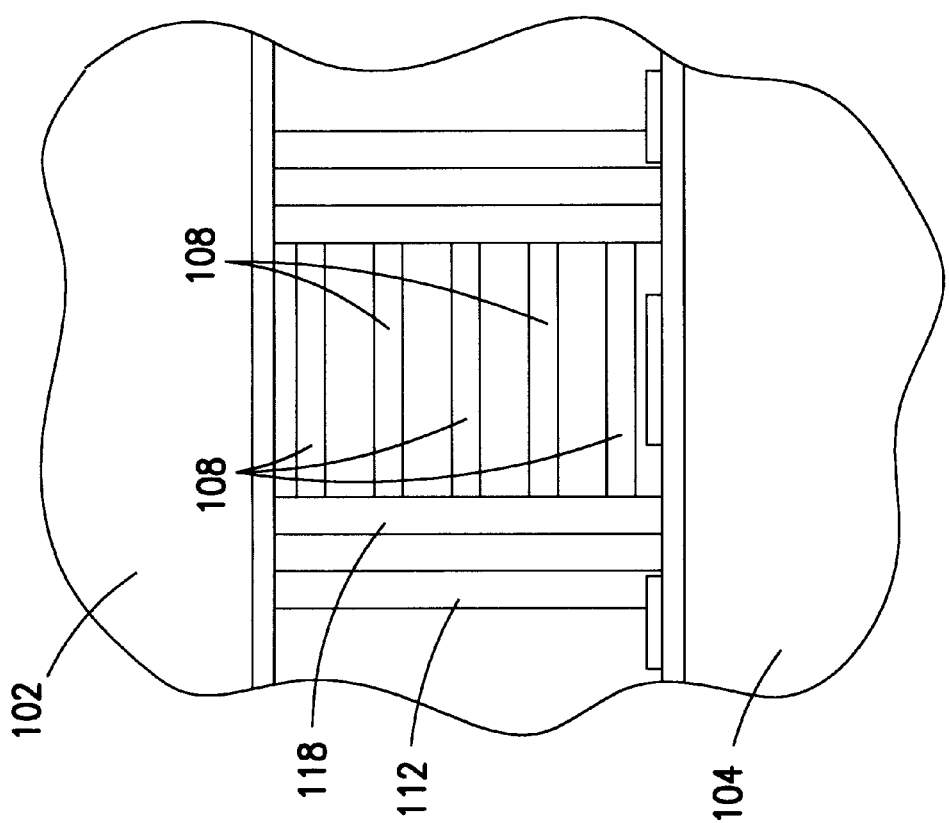
FIG. 3 is an enlarged, front elevational view of a portion of the computer system of FIG. 1.

Referring now to FIG. 3, the electronic components 108 will be briefly described. The electronic components 108 comprise a series of computer boards. An electronic chassis 118 located within the system 100 supports and provides electrical connections to the boards 108. The chassis 118 is adapted to permit easy removal of the boards 108 for maintenance/replacement. The chassis also provides electronic and power connections between the boards and an external signal junction 109 (see FIG. 4). Electrically coupled to the junction 109 is a power lead 129a and a signal input/output (I/O) connection 131. The I/O connection may connect to at single workstation (not shown) or a network of workstations (also not shown). As shown in FIG. 1, the chassis and boards are easily accessible when the upper portion 102 is opened.

Figure 4:
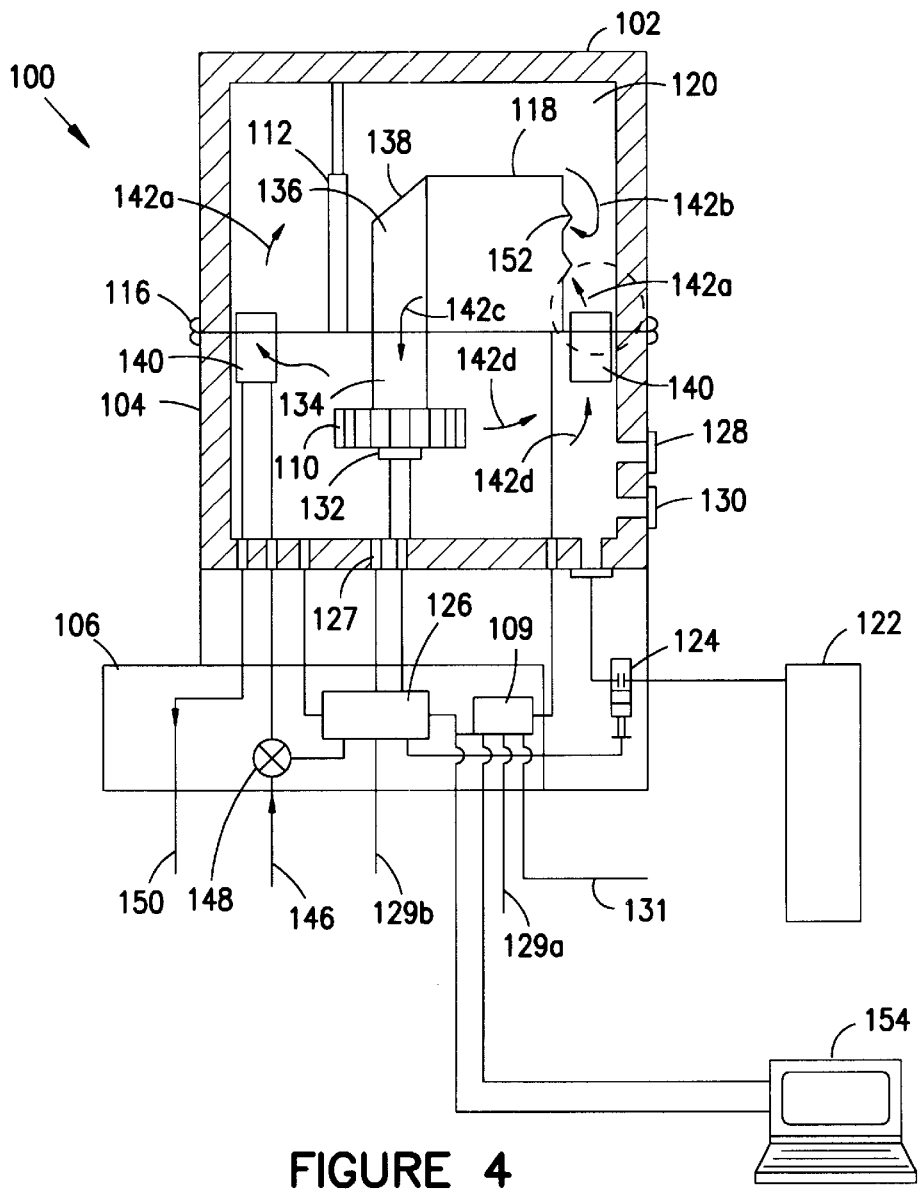
FIG. 4 is a diagrammatic view of the computer system of FIG. 1.

Referring now to FIG. 4, a diagrammatic section view of the system 100 in the closed position is shown. When in the closed position, the system 100 forms an enclosed compartment or volume 120 within the upper and lower portions 102, 104. A source of pressurized gas 122 operatively connected to the system 100 can be used to elevate the pressure of the volume 120. In one embodiment, the pressurized gas is dry nitrogen. The selection of dry nitrogen as the gas medium reduces condensation problems and also improves fire suppression. While described herein as nitrogen, other gases including but not limited to dry air are also within the scope of the invention.

The gas enters the system 100 at a gas control valve 124. The control valve 124 may be manually operated or electronic. In the case of the latter, the valve 124 may be connected to a pressure system controller 126. The pressure system controller 126 may receive external power from a power feed 129b. A pressure transducer 127 may be used to monitor the pressure within the system. The system 100 may also include a gas purge valve 128. The purge valve permits the volume 120 to vent to atmosphere before the system is opened. The system may further include a pressure relief valve 130. The relief valve 130 prevents overpressurization of the system. It is set to open whenever the pressure of the volume 120 exceeds a predefined threshold. The valves 128 and 130 may also be electronically coupled to the pressure system controller 126 (for clarity, these connections are not shown in FIG. 4). Thus, the system 100 permits selective pressurization of the interior volume 120.

In one embodiment, many components including but not limited to the valve 124, the pressure system controller 126, and the signal junction 109 are contained outside the volume 120 but within the base 106. A series of hermetic fittings permit various (electrical, coolant, pressure, etc.) connections from external components to the interior volume 120. These fittings are known in the art and are not further discussed herein.

Still referring to FIG. 4, the cooling system will now be discussed. Central to the cooling system is the gas moving device 110. The device 110 in one embodiment is a centrifugal blower having an integral, direct drive motor 132. Such blowers are commonly referred to as motorized impellers (a motorized impeller is shown in more detail in FIG. 6 as it pertains to another embodiment). While described herein as a motorized impeller, other gas moving devices including other centrifugal blowers and axial fans are also within the scope of the invention. The blower 110 draws the gas through a lower plenum 134 and disperses it into the lower portion of the volume 120. When the system 100 is closed, an upper plenum 136 is formed by a door 138 that closes over a front side of the chassis 118 and fluidly couples the front side of the chassis to the lower plenum 134. Thus a generally sealed pathway is formed between the chassis 118 and the blower 110.

Figure 4A:
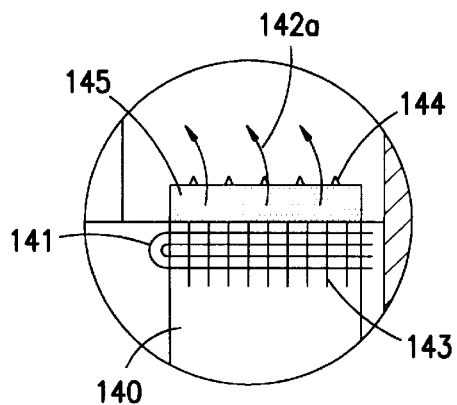
FIG. 4A is an enlarged view of a portion of FIG. 4.

In one embodiment, a series of heat removing devices or heat exchangers 140 are provided at various locations within the system 100. In one such embodiment, six heat exchangers are utilized. However, systems having other quantities of heat exchangers may be used and still fall within the scope of the invention. The heat exchangers may be of the "tube-and-fin" variety (i.e., similar to an automobile radiator) in which chilled water, refrigerant, or another cooling fluid is circulated through a series of tubes 141 (shown in FIG. 4A). Attached to the tubes are a plurality of fins 143 which extend outwardly into the moving nitrogen stream.

Referring still to FIG. 4, water enters the system 100 through an inlet line 146. The inlet line may be opened and closed by a valve 148 electrically coupled to the pressure system controller 126. The valve may be a proportional flow control valve that selectively limits the flow of water into the heat exchangers 140. Alternatively, it may be a solenoid valve or even a manual valve.

As shown by the arrows 142a, gas may pass through the heat exchangers 140 and exit into the upper portion 102. This is accomplished by a series of vents 144 located on the top of the heat exchangers 140 (see FIG. 4A). Because the upper portion of the enclosed volume 120 is isolated from the lower portion, gas may pass between the two portions only by first passing through either the plenums 134, 136 or the vents 144. An air filter 145 may be provided above the heat exchanger 140 to remove contaminants from the circulating nitrogen.

Still referring to FIG. 4, the chassis 118 has a series of chassis vents 152 located on a back side. The chassis vents 152 permit gas to be drawn through the chassis and into the plenum 136 when the blower is operating.

The operation of the present invention as it is embodied in FIGS. 1–4 will now be discussed. Referring once again to FIG. 1, with the system in its open position, access to the interior of the system 100 is provided. Maintenance and component replacement is thus easily accomplished. To ensure that the upper portion 102 remains in place, a mechanical support (not shown) may be inserted between the portions 102 and 104 before accessing the interior.

When the system is ready for operation, the upper portion may be lowered by selective activation of the lift mechanism 112. When the upper portion 102 has reached the closed position as shown in FIGS. 2 and 4, an air-tight seal is formed between by the seal 114 and the upper portion 102. At this point, the upper and lower portion may be secured by various means as discussed above (lift mechanism, circumferential clamp, etc).

Once secured, the pressurization of the interior volume 120 may begin. While described generally herein, this process may be partially or wholly automated by the pressure system controller 126. In turn, the pressure system controller may be remotely controlled by a control station 154 as shown in FIG. 4. Alternatively, the pressure system controller 126 may be partially or entirely incorporated into the station 154. If desired, the volume 120 may first be purged or, alternatively, evacuated with a conventional vacuum pump and fitting (not shown) to remove the air. To begin pressurization, the valve 124 opens and pressurized gas is introduced. The gas is monitored by the pressure transducer 127. When the pressure reaches a predetermined limit, the pressure transducer signals the controller 126 to close the valve 124. The pressure relief valve 130 will vent if the pressure inside the system ever exceeds design thresholds. Once the system reaches the desired pressure, the valve 124 closes and the pressure is maintained within the sealed volume 120. However, the pressure transducer 127 may continually monitor pressure and signal the controller 126 whenever the pressure drops below a specified minimum. If this occurs, the controller 126 may open the valve 124 to restore pressure. The controller may also report the event in a system log or otherwise notify the operator of the possible leak.

Once the system is pressurized, power to the blower 110 and coolant flow to the heat exchangers 140 is initiated. Once the cooling system is operating, the electronic components 108 may be powered. At that point, the components 108 begin generating heat. When the blower 110 is operating, gas is drawn through the vents 152 as shown by arrow 142b in FIG. 4. The gas then passes over the hot electronic boards 108. As the cool gas passes over the boards, heat energy is transferred to the gas. The heated gas is then drawn into the plenum 136 as shown by arrow 142c. The gas accelerates through the blower 110 and into the lower portion 104 (see arrow 142d). Since the only exit for the gas is through the filters 145 and the vents 144, the gas is drawn through the heat exchangers 140 and on through the vents 144 (see arrows 142a). As the heated gas passes over the cold tubes 141 and fins 143 of the heat exchanger 140, heat energy is transferred from the gas to the chilled water inside the tubes, thus lowering the temperature of the gas and raising the temperature of the water. The warmed water then exits the system through line 150. The now-cooled nitrogen gas can then move through the chassis 118 again. Accordingly, a closed-loop flow pattern is generated within the volume 120 where heat is transferred from the electronic components 108 to the circulating nitrogen and finally removed by the heat exchangers 140.

The heat exchanger 140 may operate from a municipal water supply or from an external closed system. In the latter, the heated water at line 150 enters an external cooling system where the water is cooled before returning to the system 100 via the line 146. The control system 126 may monitor various parameters including water (or refrigerant) temperature, internal system 100 temperature, and water flow rate. The valve 148 may be selectively opened and closed in response to these inputs to more efficiently manage to the use of the coolant water.

Figure 5:
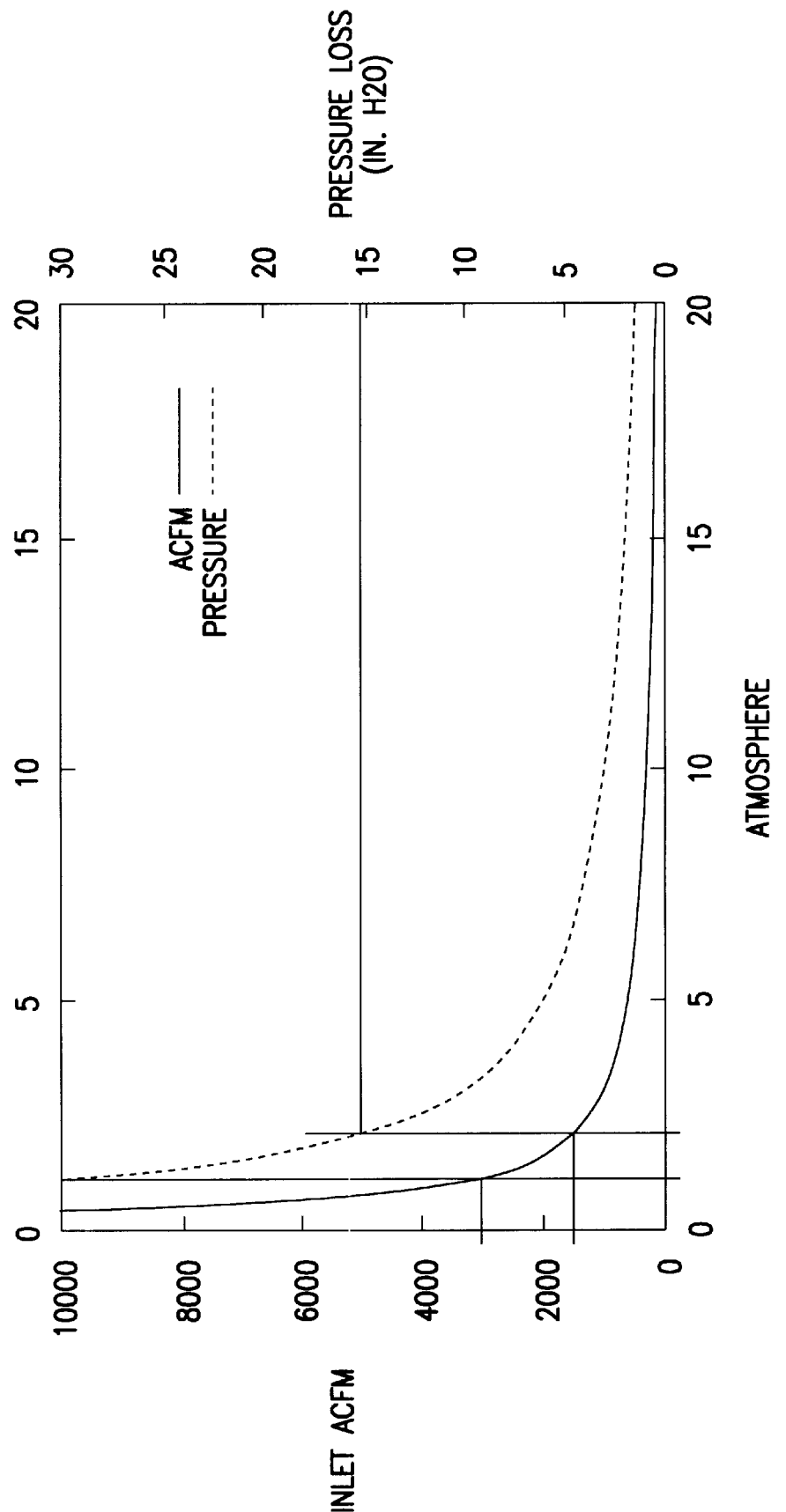
FIG. 5 is a graph showing the relationship between pressure and required volumetric flow base on a hypothetical system having a heat load of 35 KW.

The advantageous results of system pressurization are shown in FIG. 5. This graph is based on a hypothetical system having a heat load of 35 kilowatts. Starting with a baseline of 1 atmosphere (14.7 psia, standard atmospheric pressure at sea level), the volumetric flow requirement for the blower is approximately 3200 actual cubic feet per minute (ACFM). This flow rate will result in a pressure drop of approximately 30 inches $H_2O$ at a 20° C. air temperature rise. However, by increasing system pressure to 2 atmospheres (29.4 psia, or two times the ambient pressure at sea level), the same heat load can be removed by a blower rated at approximately 1600 ACFM with a corresponding reduction in pressure drop to 15 inches $H_2O$. Or, stated alternatively, by pressurizing the volume to 2 atmospheres, a 50% drop in required blower volumetric flow and a 50% reduction in pressure loss can be obtained. While further increases in system pressure will produce additional reductions in required volumetric flow and pressure loss, the benefit gained begins to diminish when compared to the structural changes required to withstand the increased pressure. Additionally, pressures beyond a certain threshold may require additional pressure vessel design considerations which may further increase complexity and cost. However, systems that are pressurized in excess of 2 atmospheres are within the scope of the invention.

Accordingly, the elevated pressure of the confined gas is advantageous in that it provides generally identical heat removal with a smaller blower. This advantage is attributable to the fact that, since centrifugal blowers are essentially constant volume devices, an increase in gas density results in a proportional increase in the mass flow rate of the blower. Stated alternatively, for a given mass flow rate requirement, the volumetric flow rate and thus the size of the blower, can be reduced proportionally to an increase in gas density. For example, the same mass flow rate can be achieved at half the volumetric flow rate if the gas density is doubled. Since the density of the gas is generally proportional to its pressure, a smaller blower 110 can be utilized in a elevated pressure environment and provide the same mass flow rate as a larger blower in an unpressurized application. While the present invention is more costly than conventional (i.e., unpressurized) forced air or forced gas cooling, it is perceived to be less complicated and more economical than liquid cooling.

It is also noteworthy that the higher pressure, lower velocity gas does not adversely affect its heat transfer properties. More particularly, the heat transfer coefficient of the gas remains generally unchanged. To elaborate, the heat transfer coefficient is proportional to the dimensionless Nusselt number (Nu) which may be expressed as:

$$Nu = 0.023 * Pr^{.33} * Re^{.08}$$

where Pr represents the Prandtl number, a dimensionless ratio of the momentum and thermal diffusivities, which may be expressed as:

$$Pr = (C_p * \mu)/k$$

where $C_p$=specific heat of the gas; $\mu$=the dynamic viscosity; and k=thermal conductivity, and where Re represents the Reynolds number, a dimensionless ratio of inertia to viscous forces which may be expressed as:

$$Re = (V*D)/(\mu/\rho)$$

where V=velocity of the fluid; D=the hydraulic diameter; and $\rho$=gas density. Since $C_p$, $\mu$, and k remain generally constant with pressure, Pr remains constant. Using the example above where pressure (and thus gas density) is increased from 1 to 2 atmospheres and velocity is halved, Re also remains constant. Accordingly, The Nusselt number, and thus the heat transfer coefficient, remains unaffected when the system pressure is increased by one atmosphere and the volumetric flow rated is halved. Alternatively, for a given mass flow rate, the heat carrying capacity of the gas can be increased proportionally with the pressure of the gas.

By increasing the pressure within the system 100, a smaller blower 110 can be used. Furthermore, pressurization permits the use of gas cooling in situations where heat removal requirements would otherwise render a blower prohibitive. In addition, pressurization allows the use of a smaller blower at high elevations. For example, removal of the 35 KW load discussed above at an elevation of 8000 feet with a unpressurized system would require a blower capable of moving 4100 CFM at a pressure loss of 37" of $H_2O$. This would require a 50 HP blower. However, if the system is pressurized to 2 atmospheres (29.7 psia) as described above, the blower requirements would be 1600 CFM at a pressure loss of 15" of $H_2O$, necessitating only a 10 HP motor. While it is possible that pressure losses may be 10–20% higher due to compressibility and turbulence effects, a substantial reduction is still realized. Thus, the forced air or forced gas cooling system of the present invention provides a significant reduction in blower size and power requirements over conventional force air systems. Because a smaller blower may be used, computer designers may utilize forced air cooling in applications where such systems would normally be considered prohibitive.

Figure 6:
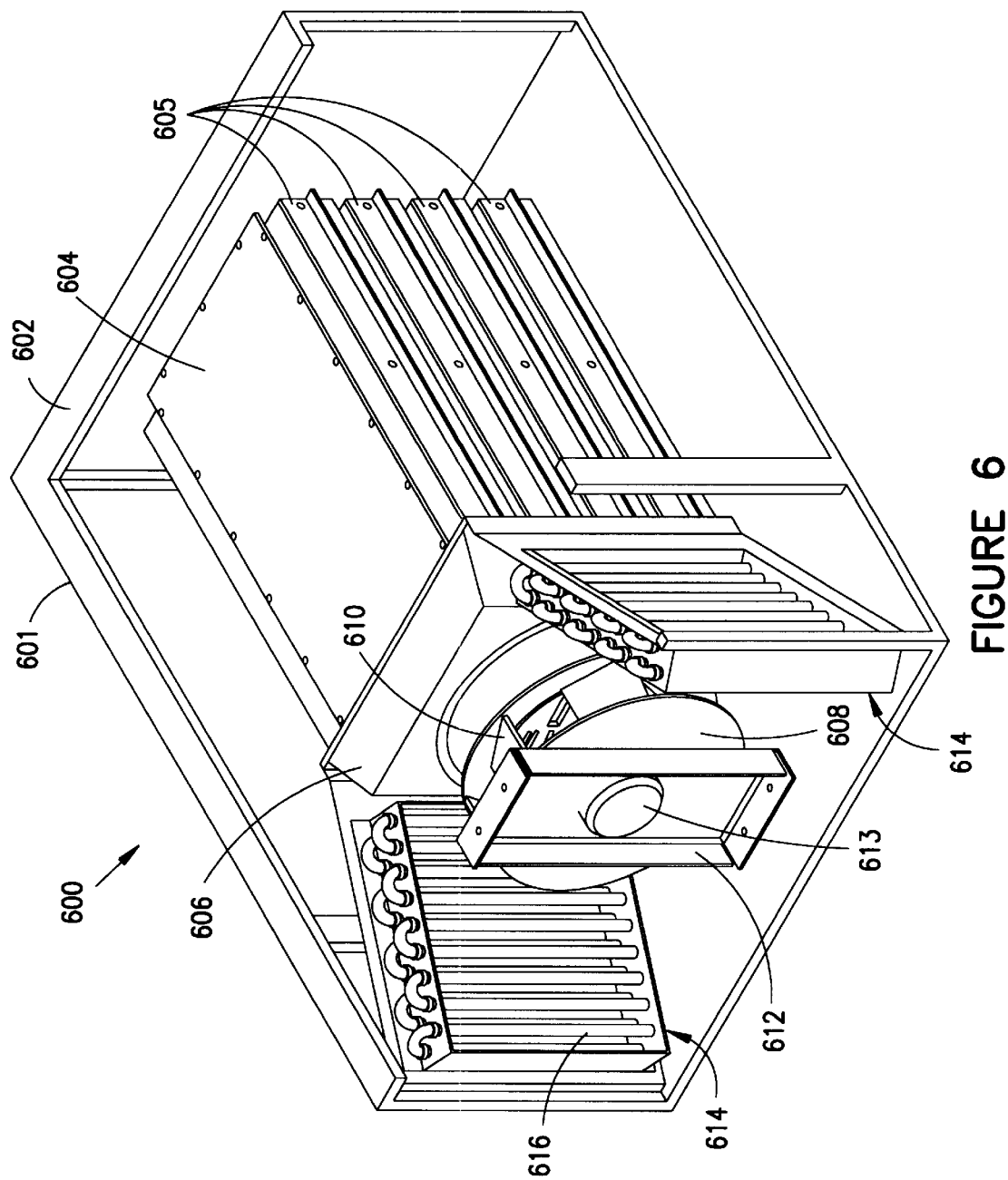
FIG. 6 a partial perspective view of another embodiment of a computer system in accordance with the present invention.
Figure 7:
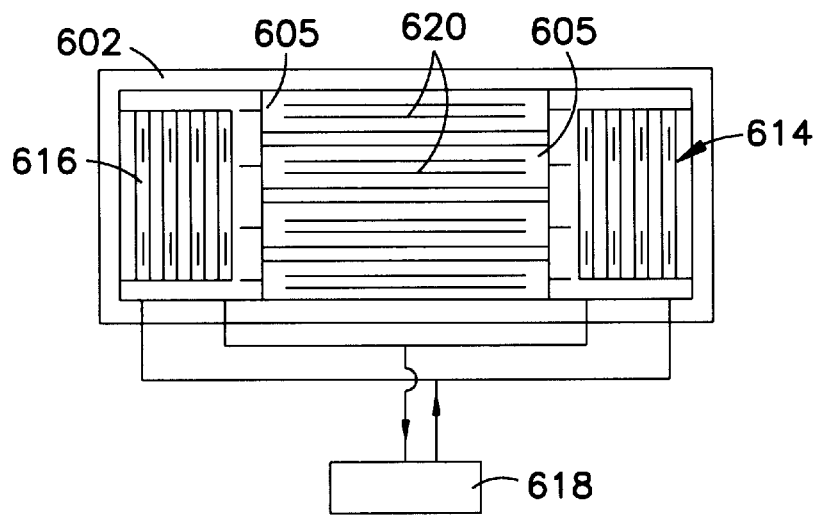
FIG. 7 is a rear elevational view of the computer system of FIG. 6.
Figure 8:
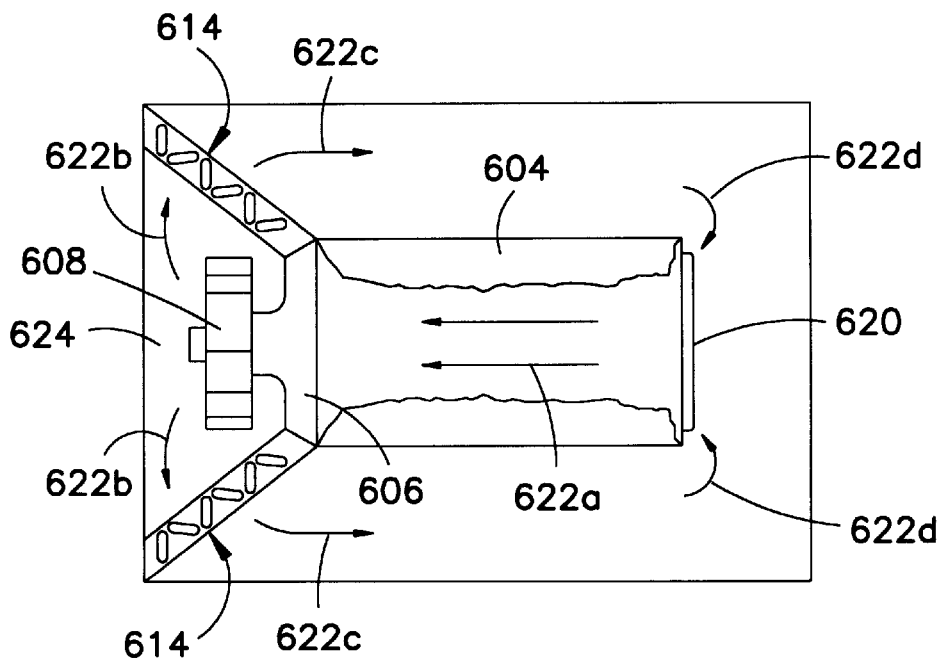
FIG. 8 is a top plan view of the computer system of FIG. 6.

Referring now to FIG. 6, another embodiment of the present invention will be described. While the embodiment of FIGS. 1–5 is directed to large, sophisticated computers, the embodiment described below and shown in FIGS. 6–8 is directed to smaller, mini computers. The computer system 600 comprises an enclosure or cabinet 601 in the shape of a rectangular box. Enclosures having other shapes are also within the scope of the invention. In FIG. 6, the enclosure 601 is shown with the top and side panels removed for clarity. However, when assembled, the panels form an air-tight, sealed compartment.

The cabinet 601 comprises a box-like frame 602 which supports the cabinet components. Located generally toward the center of the cabinet is an electronic support assembly 604 comprising four electronic modules 605. While shown with four modules, any number of modules could be used and still fall within the scope of the invention. Similar to the other embodiments described herein, the electronic modules 605 produce significant amounts of heat during operation. This heat must be removed in order to keep the modules 605 operating reliably and efficiently.

Proximal to a first end of the assembly 604 is a plenum housing 606. Located on the opposite side of the housing 606 is a centrifugal blower 608 having a series of vanes 610. Like the embodiments discussed in FIGS. 1–5, the centrifugal blower is preferably a motorized impeller. The motorized impeller is a centrifugal blower with no external scroll housing (i.e., the vanes are not contained) and typically incorporating a motor 613 into its axial hub. While described herein as a motorized impeller, other fluid moving devices including other centrifugal blowers and axial fans may also be used and still fall within the scope of the invention. The blower is supported by a bracket 612. The plenum 606 provides a fluid connection between the electronic modules 605 and an air inlet (not shown) on the blower 608.

Referring to FIGS. 6 and 7, extending at an angle from each side of the plenum housing 606 are heat exchangers 614. Like the heat exchangers 140 described herein, the heat exchangers 614 utilize a series of spaced-apart tubes 616 passing vertically through the enclosure 601. The tubes may or may not include fins to increase the area in contact with the circulating gas. Within the tubes 616 is contained a circulating liquid coolant. The tubes 616 absorb excessive heat energy from the enclosure and transfer it to the liquid coolant as further described below.

The liquid coolant may be chilled water or a refrigerant utilizing an attached or remote external refrigeration unit 618 (see FIG. 7). In addition, other liquid cooling sources are also contemplated within the scope of the invention.

Various hermetically sealed fittings (not shown) permit electrical, pressure, and coolant connections to points outside the enclosure 601.

As with the embodiments already discussed, various gases may be utilized within the system 600. For simplicity, the gas used in the system 600 will be described as nitrogen. As previously described, the gas may be supplied from an external source through a valve (not shown). The pressurization process may be automated or manual. Like the system 100, the system 600 may include various valves, transducers, and other sensors to monitor and control system pressure. As a cost saving measure, the system 600 may be manually pressurized and sealed during manufacture.

Once sealed and pressurized, the system 600 may be cooled in a fashion substantially identical to that described with reference to FIGS. 1–5. Specifically, when the blower 608 is activated, the cool nitrogen within the enclosure is drawn through the support assembly 604 as represented by arrows 622a in FIG. 8. The gas enters the electronic support assembly 604 through a series of vents 620 (shown in FIGS. 7 and 8) where it is heated by the modules 605. The heated gas then passes through the plenum 606 and into the blower where it is discharged into an area 624 as shown in FIG. 8. The heated gas then passes through the heat exchangers 614 as shown by arrows 622b. As it passes through the heat exchangers, the heated nitrogen is cooled by the cool tubes 616. The liquid coolant within the tubes then removes the heat from the enclosure 601. The cooled nitrogen is then drawn toward the vents 620 by the suction of the blower 608 as generally indicated by the arrows 622c and 622d. When the top and side panels are installed, the only path between the blower 610 and the vents 620 is through the heat exchangers 614 and back through the assembly 604. Accordingly, the heated nitrogen is cooled before it is recirculated through the electronic modules 605.

An improved system and method is described permitting the use of forced air or forced gas cooling in applications where it would normally be prohibitive. In addition, the present invention permits a reduction in blower size for a given heat removal requirement. Furthermore, the present invention eliminates the need to size a forced air or forced gas cooling system based on high elevation requirements. Accordingly, the forced air or forced gas system and method described herein provide an alternative to sophisticated and expensive liquid cooling techniques.

Applications involving the cooling of electronic components within a pressurized computing system have been described. These techniques can, however, be extended to the cooling of other heat generating devices without departing from the scope of the invention.

Preferred embodiments of the present invention are described above. Those skilled in the art will recognize that many embodiments are possible within the scope of the invention. Variations, modifications, and combinations of the various parts and assemblies can certainly be made and still fall within the scope of the invention. Thus, the invention is limited only by the following claims, and equivalents thereto.

We claim:

1. A computer system comprising:

an upper cylindrical portion;

a lower cylindrical portion, wherein the lower cylindrical portion mates with the upper cylindrical portion to define an interior volume which retains a gas at a first pressure, the first pressure being greater than an ambient pressure outside the enclosure;

one or more heat generating electronic components located within the interior volume;

a centrifugal blower located within the interior volume; and one or more heat exchangers located within the interior volume, wherein the heat exchangers remove a quantity of heat energy from the system.

2. The computer system of claim 1 further comprising a lift mechanism to separate the upper cylindrical portion from the lower cylindrical portion.

3. The computer system of claim 1 further comprising a source of pressurized gas operatively coupled to the system and adapted to provide the gas at the first pressure.

4. The computer system of claim 1 wherein the centrifugal blower is adapted to recirculate the gas between the heat generating components and the heat exchangers.

5. The computer system of claim 1 wherein the heat exchangers comprise a series of tubes having a liquid coolant therein, wherein the quantity of heat energy is conducted through the tubes to the liquid coolant.

6. The computer system of claim 5 further comprising a pressure system controller to monitor and control the first pressure and the liquid coolant.

* * * * *